United States Patent [19]

Grabbe

[11] Patent Number: 5,432,679
[45] Date of Patent: Jul. 11, 1995

[54] PRESSURE EQUALIZER FOR AN INTEGRATED CIRCUIT CHIP INTERCONNECTED TO CIRCUITRY ON A THIN FILM MEMBRANE

[75] Inventor: Dimitry G. Grabbe, Middletown, Pa.

[73] Assignee: The Whitaker Corporation, Wilmington, Del.

[21] Appl. No.: 251,080

[22] Filed: May 31, 1994

[51] Int. Cl.[6] .............................................. H05K 7/12
[52] U.S. Cl. .................................. 361/769; 361/709; 361/770; 361/749; 439/71
[58] Field of Search ............... 257/707, 718, 719, 725, 257/726, 727; 361/707, 709, 717, 718, 714, 715, 767, 768, 765, 770, 785, 771, 749; 439/61, 71, 73, 66

[56] References Cited

U.S. PATENT DOCUMENTS

| | | | |
|---|---|---|---|
| 4,169,642 | 10/1979 | Mouissie | 439/71 |
| 4,658,331 | 4/1987 | Berg | 361/704 |
| 5,162,613 | 11/1992 | Schoenthaler | 439/66 |
| 5,273,440 | 12/1993 | Ashman et al. | 439/71 |
| 5,298,686 | 4/1994 | Bourdelaise et al. | 361/785 |

Primary Examiner—Leo P. Picard
Assistant Examiner—D. Sparks
Attorney, Agent, or Firm—Bruce J. Wolstoncroft

[57] ABSTRACT

An integrated circuit chip module assembly (10) is disclosed that electrically interconnects the bond pads of the various integrated circuit chips (20) in the module to circuitry (42) on a thin film multilayer membrane (22). The module assembly includes a heat sink (16) with the back surfaces of the chips (20) in thermal engagement therewith. Contacts (40) of the bond pads of the chips (20) are in electrical engagement with the circuitry (42) on the membrane (22) and are accurately positioned by means of nests (28) formed on the surface of the membrane (22). A contact pressure equalizer (12) engages only selected areas (98) of the membrane (22) opposite the contacts (40) of the chips (20) to urge the contact surfaces (44) on the membrane (22) into electrical engagement with raised contacts (40). The contact pressure equalizer (12) includes a relatively large pressure plate (70) having a layer (74) of relatively soft rubber thereon. A plurality of rigid plates (78) are positioned on the soft rubber layer (74) so that each plate is opposite a respective chip (20). A narrow strip (88) of relatively hard rubber is positioned on each of the rigid plates (78) so that the hard rubber strips engage only the selected areas (98) of the membrane (22). The heat sink (16) and the pressure plate (70) are then bolted together with the chips (20), the hard rubber strips (88), the rigid plates (78), and the soft rubber layer (74) sandwiched in between.

14 Claims, 5 Drawing Sheets

PRESSURE EQUALIZER FOR AN INTEGRATED CIRCUIT CHIP INTERCONNECTED TO CIRCUITRY ON A THIN FILM MEMBRANE

The present invention relates to the electrical interconnection of integrated circuit chips to electrical circuitry on a thin film membrane, and in particular to the equalization of pressure at the several contact points.

BACKGROUND OF THE INVENTION

Integrated circuit chip modular assemblies are being developed for use in computer work stations and other similar equipment where the bond pads on the surface of each chip are directly interconnected to circuitry on thin film multilayer membranes. Such multilayer membranes are composed of a layer of polyamide and a layer of copper on the polyamide with circuitry etched into the copper. Gold plated contact surfaces are arranged on the copper circuitry for mating with bond pads on the chips, the contact surfaces and bond pads having identical pattern layouts. The surface of the membrane is coated with a photo sensitive polymer, masked, and developed to form boundary structures or nests for receiving the chips. The nests have features that very precisely locate the chips with respect to the contact surfaces so that the bond pads are in alignment therewith. Each of the bond pads of the chips has a small gold contact ball attached thereto for contacting its respective contact pad on the membrane. Each gold ball is formed by wire bonding a soft gold wire to the bond pad in the usual manner and then breaking the wire off near the bond joint leaving a short stub. The stub is then formed into a ball, or other desired shape, and a desired height above the surface of the chip by mechanical means such as coining or by other suitable means. The membrane is held taut in a rectangular frame. The chips are positioned within their respective nests on the membrane and backed up on their opposite surfaces with a heat sink in the usual manner. A somewhat soft rubber member, about the same size as the membrane, is positioned against the side of the membrane opposite the chips. A pressure plate urges the rubber member against the membrane so that the contact surfaces are pressed against their respective gold contact balls on the chips with a force that is proportional to the hardness of the rubber member. The hardness is chosen to provide a desired contact force. As the rubber member is pressed against the membrane, however, relatively large tensile stresses are imposed on the membrane. This occurs because the soft rubber member and the membrane will deform around the contact balls while the remaining area of the rubber member pushes against the taut surface of the membrane. This perpendicular loading of the taut surface of the membrane results in substantial tensile forces in the direction of the plane of the membrane which will either break the bond between the membrane and the frame or will result in other dimensional distortions that may affect the reliability of the product.

What is needed is an integrated circuit chip module assembly having a contact pressure equalizer that applies a desired amount of force to each contact without resulting in adverse tensile forces in the membrane.

SUMMARY OF THE INVENTION

An integrated circuit chip module assembly is disclosed including a membrane having electrical circuitry thereon. Contact surfaces are on a first major surface of the membrane interconnected to the circuitry. A support frame is attached to at least a portion of the periphery of the membrane thereby supporting the membrane taut so that the first major surface defines a plane. At least one integrated circuit chip is provided having contacts on a surface thereof interconnected to circuitry on the chip. Each of the contacts projects outwardly from the surface into electrical engagement with a respective one of the contact surfaces of the membrane. A contact pressure equalizer is arranged in pressing engagement only with selected areas of a second major surface of the membrane opposite the first major surface. The selected areas are substantially opposite the contacts so that the contact surfaces of the membrane are urged against respective contacts of the chip.

DESCRIPTION OF THE PREFERRED EMBODIMENT

Figure 1:
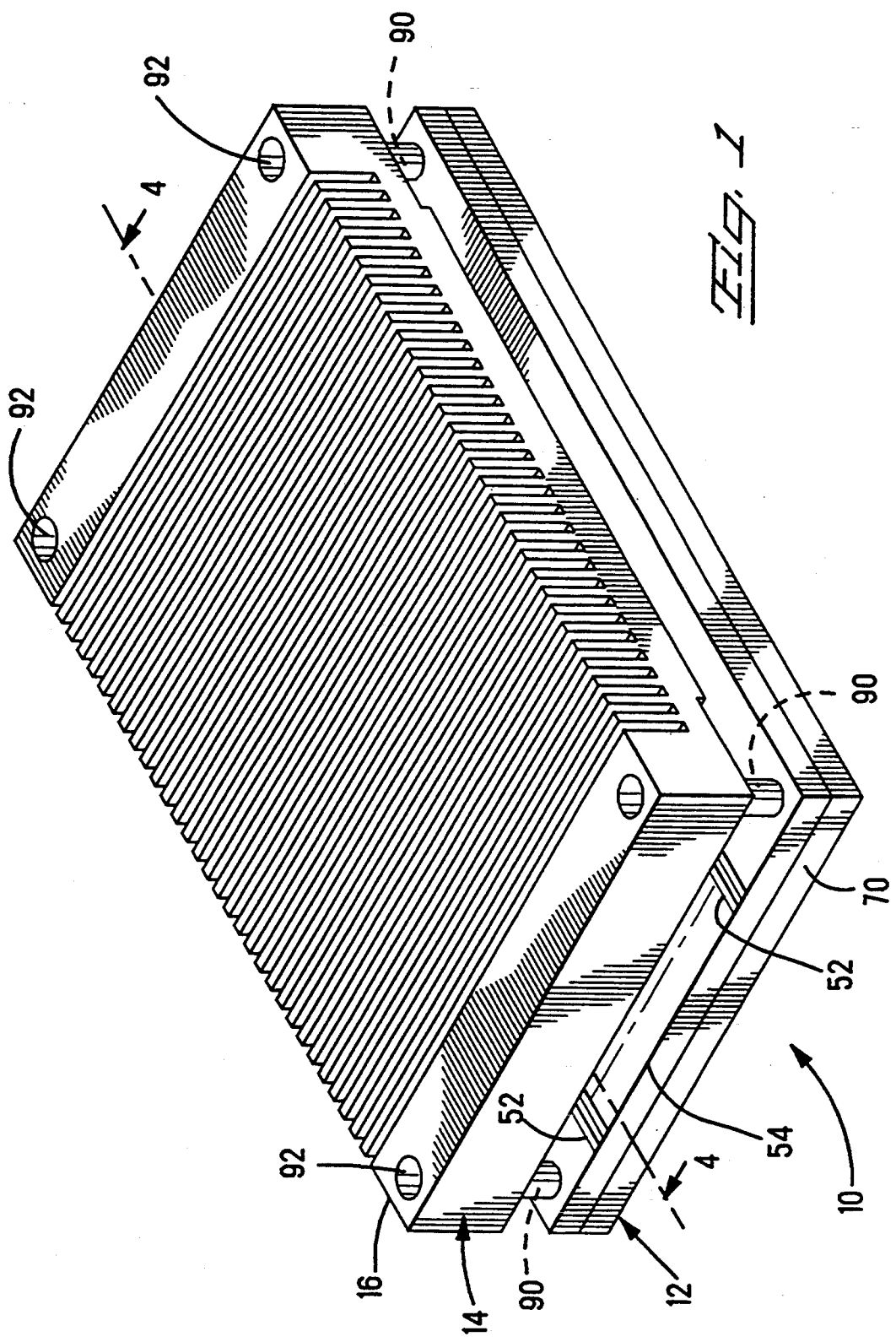
FIG. 1 is an isometric view of a multichip module assembly incorporating the teachings of the present invention.
Figure 2:
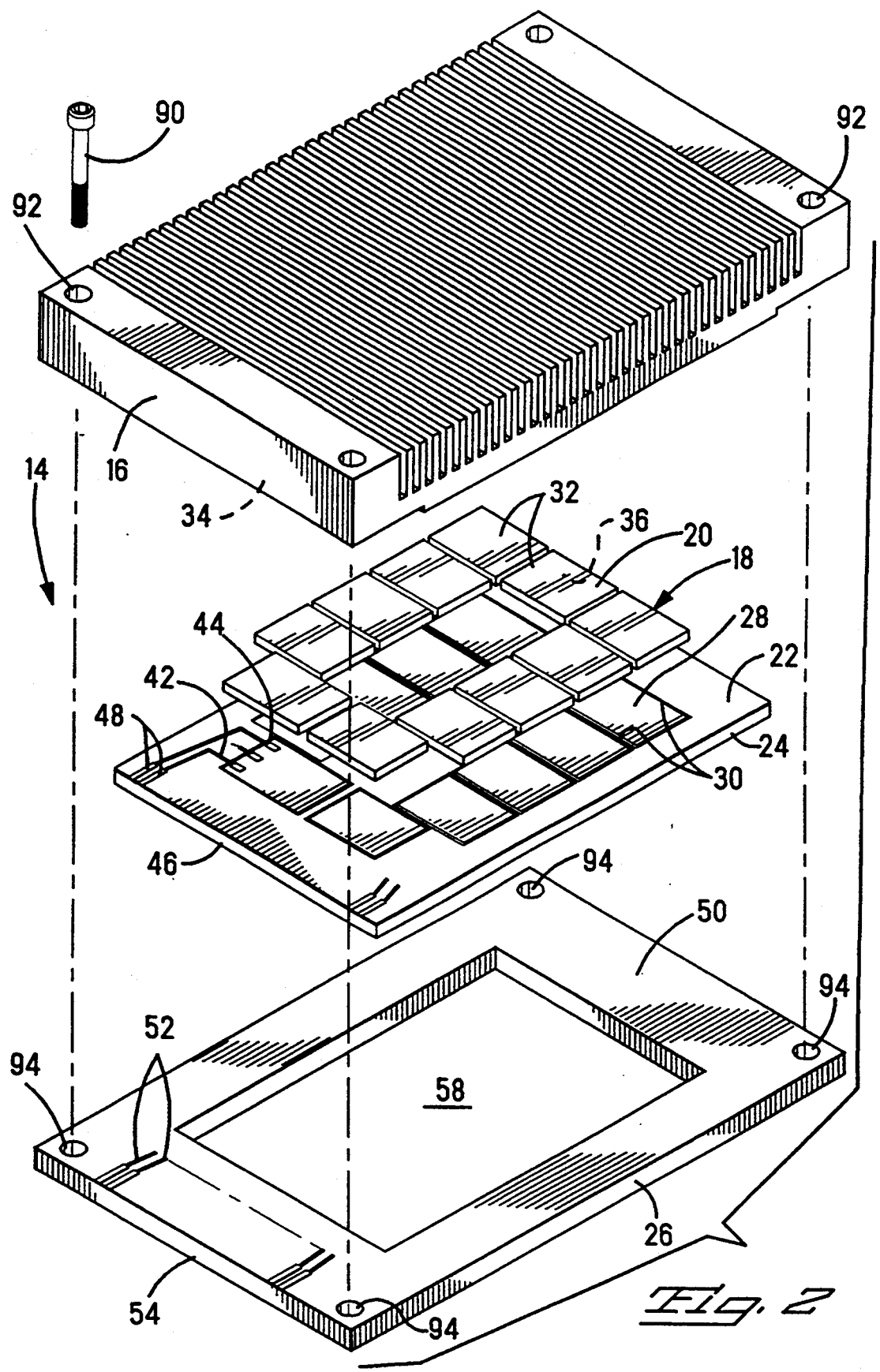
FIG. 2 is an exploded parts isometric view of a portion of the multichip module shown in FIG. 1 without a contact pressure equalizer.
Figure 4:
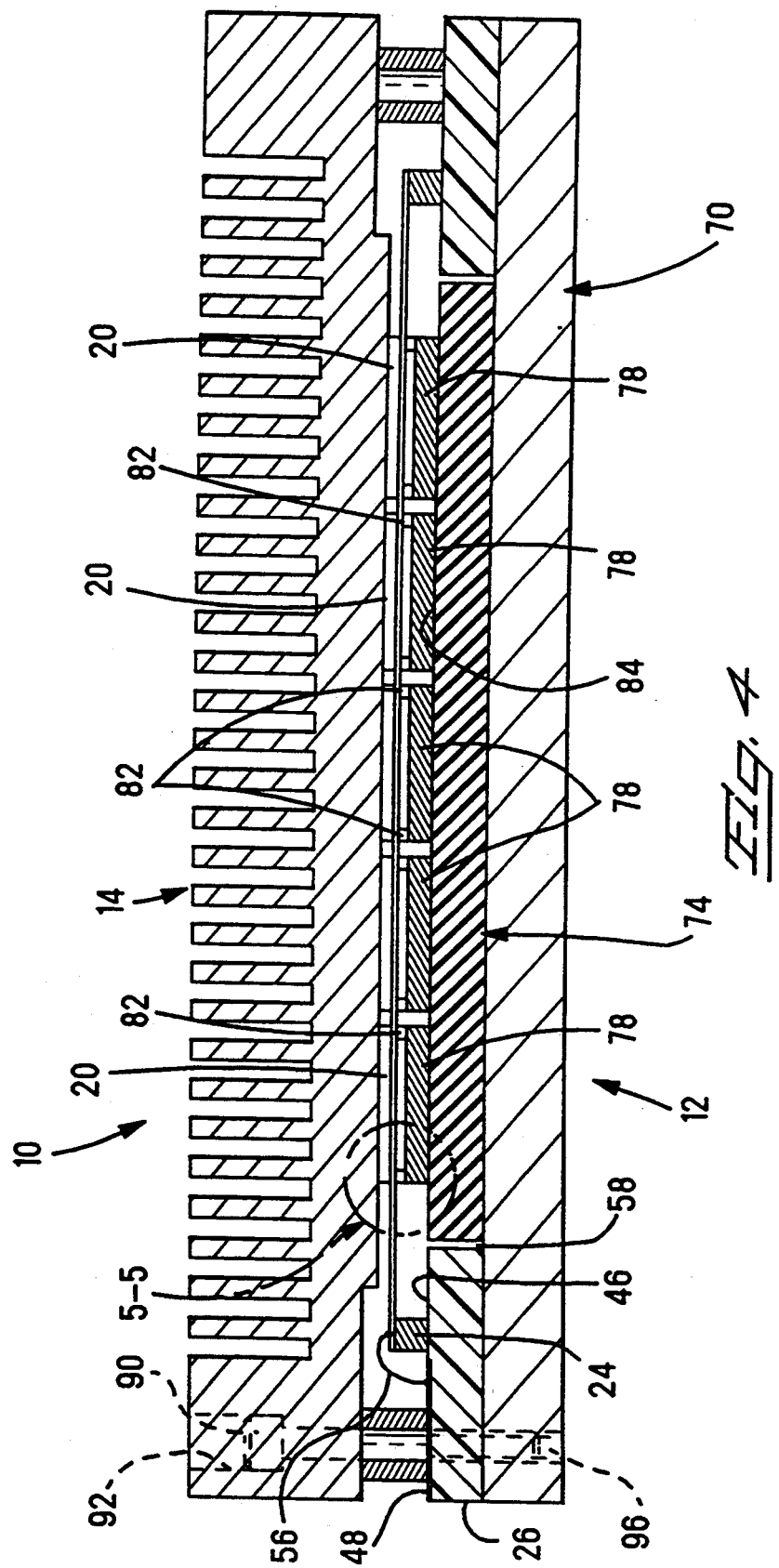
FIG. 4 is a cross-sectional view of the multichip module taken along the lines 4—4 of FIG. 1.
Figure 5:
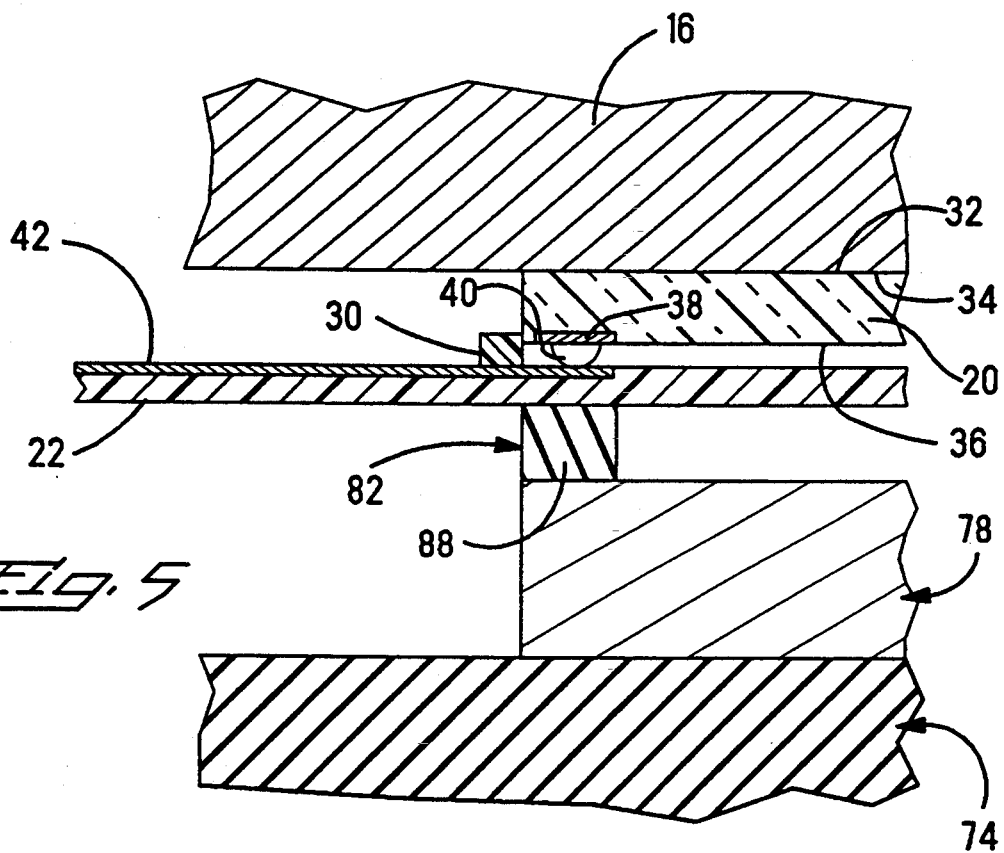
FIG. 5 is an enlarged view of a portion indicated as 5—5 in FIG. 4.

There is shown in FIG. 1 a multichip module assembly 10 having a contact pressure equalizer subassembly 12 and a chip and membrane subassembly 14. As best seen in FIG. 2, the chip and membrane subassembly 14 includes a heat sink 16, a set 18 of eleven integrated circuit chips 20, a thin film multilayer membrane 22 attached to a frame 24, and a circuit board 26. The frame 24 has a rectangular cross section, as best seen in FIG. 4, with the peripheral edge of the membrane attached to the frame so that the membrane is held taut. In the present example, the membrane and frame assembly are made by depositing the multilayer thin film membrane 22 onto a flat aluminum plate. A layer of photoresist is deposited onto the surface of the membrane 22, exposed through a mask to define nests for receiving the chips 20, and then developed to form accurately positioned nests 28 having peripheral walls 30. The center portion of the plate is then etched away leaving the frame 24 with the membrane stretched across one side of it, as shown in FIGS. 2 and 4. The upper surfaces 32 of the chips 20 are arranged in thermal contact with a planar surface 34 of the heat sink 16 with a layer of thermal conducting jell between the surfaces. The opposite surfaces 36 of the chips 20, as seen in FIG. 5, have spaced bond pads 38 arranged thereon that are in electrical communication with the various circuits in the chip, in the usual manner. As is well known in the industry, electrical interconnection of the chip circuitry to external leads is usually accomplished by pressure bonding small diameter gold wires to the bond pads of the chip and to a lead frame that is part of the chip's packaging. In the present case, the gold wire is pressure bonded to a bond pad of the chip and then broken off near the bond joint so that a short stub remains attached to the bond pad. The stub is then formed into a raised contact 40 of desired shape and height above the surface of the chip by mechanical means such as coining or by other suitable means. Such a raised contact 40 is formed on each bond pad 38 of each chip 20 in this manner. Alternatively, the raised contacts may be provided by electroforming or other suitable means.

The multilayer membrane 22 includes circuitry 42 etched into metalization that is part of the multilayer membrane. Gold plated contact surfaces 44, in electrical communication with the circuitry 42, are positioned within each of the nests 28 in alignment with the raised contacts 40 of the respective chip 20 that is positioned in each nest 28. The circuitry 42 terminates along one edge 46 of the membrane in first metalized strips 48 for a purpose that will be explained. The frame 24 with attached membrane 22 is disposed on an upper planar surface 50 of the circuit board 26, as shown in FIGS. 2 and 4. The circuit board 26 includes second metalized strips 52 on the surface 50 adjacent the edge 46 of the frame 24 that extend to the edge 54 of the circuit board 26. As best seen in FIG. 4, the first metalized strips 48 of the membrane 22 are electrically interconnected to respective second metalized strips 52 on the circuit board 26 by means of small diameter gold wires 56 being wire bonded thereto in the usual manner. This completes the circuit from the circuitry in the integrated circuit chips 20 to the metalized strips 52 along the edge 54 of the circuit board 25. A standard surface mount connector, not shown, may be connected to the metalized strips 52 for electrically connecting the multichip module assembly 10 to other equipment. Instead of the second metalized strips 52 extending to the edge 54 of the circuit board 26, they may terminate in connector contacts such as pins, not shown, that are arranged to mate with a connector having standard receptacle contacts. An opening 58 is formed in the center of the circuit board 26 for a purpose that will be explained below.

Figure 3:
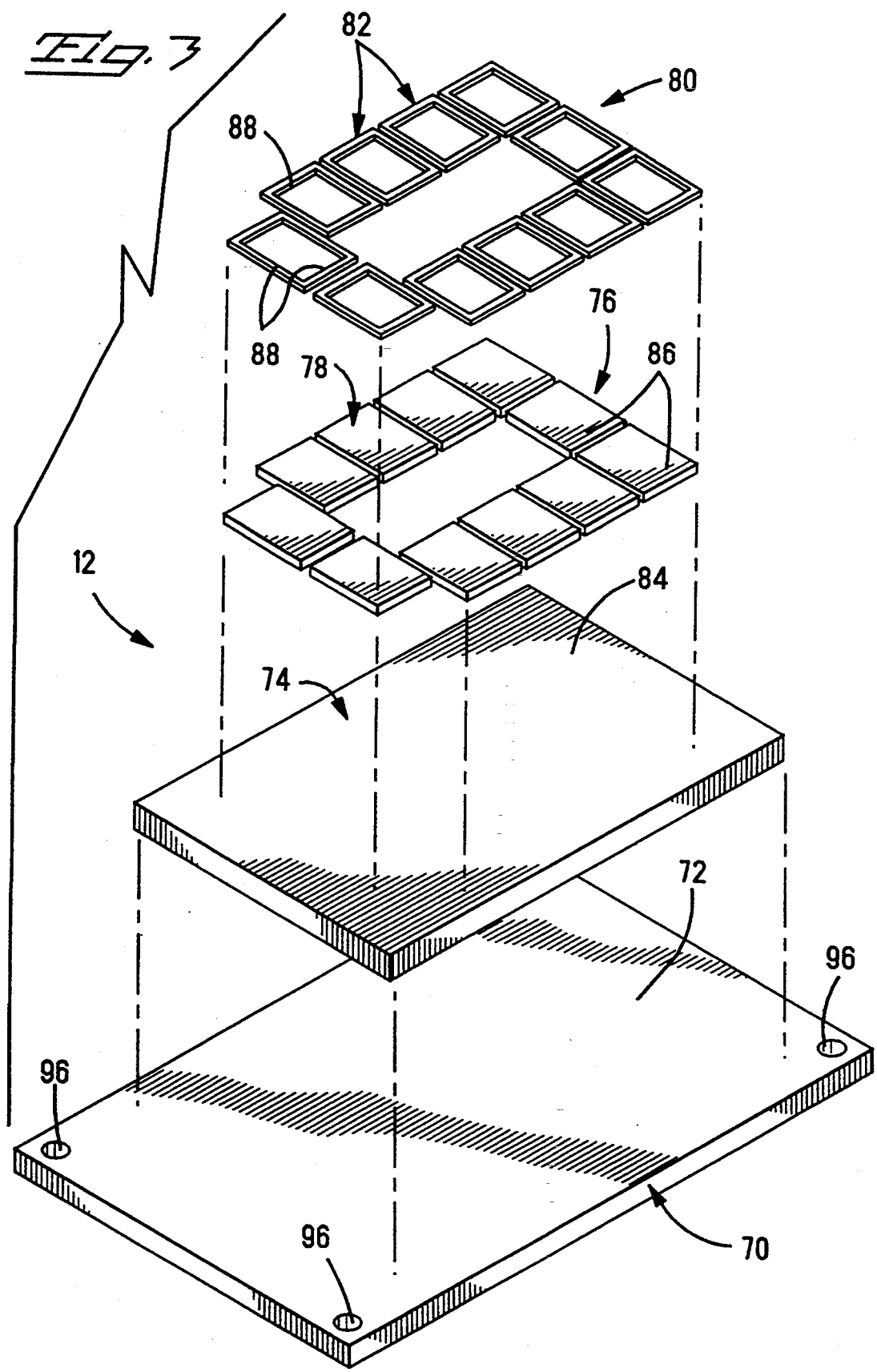
FIG. 3 is an exploded parts isometric view of a contact pressure equalizer shown in FIG. 1.

As shown in FIG. 3, the contact pressure equalizer 12 includes an aluminum pressure plate 70 having a planar major surface 72, a rectangular pressure pad 74 of relatively soft rubber, a set 76 of eleven aluminum plates 78, and a set 80 of eleven contact pads 82 of relatively hard rubber, the eleven contact pads having a one to one correspondence with the eleven aluminum plates. The eleven plates 78 are positioned on a surface 84 of the pressure pad 74 in a pattern that corresponds precisely to the relative positions of the chip nests 28 in the membrane 22. Each plate 78 is approximately the same size as the chip 20 that is in the nest 28 that corresponds to the plate. Each plate 78 has an upwardly facing surface 86 that is flat, one of the contact pads 82 being attached to a respective one of these flat surfaces by means of adhesive or other suitable means. Each contact pad 82 is in the form of a narrow strip 88 that extends around the periphery of its corresponding plate 78 in the shape of a frame. Each of the narrow strips 88 is centered in alignment with the raised contacts 40 attached to the chip 20 in the nest 28 corresponding to the plate 78 so that the strips engage only a selected area 98 of the surface of the membrane, as shown in FIG. 5. When the contact pressure equalizer 12 is in assembled position with the chip and membrane assembly 14, as shown in FIG. 4, the pad of rubber 70 extends through the opening 58 in the circuit board 26. The total thickness of each plate 78 and its respective contact pad 82 is substantially the same as the thickness of the frame 24. The entire assembly 10 is held together with four bolts 90 that extend through counterbored holes 92, through clearance holes 94, and into threaded holes 96 in the pressure plate 70, as best seen in FIG. 4.

The thickness of the rubber pad 74 is chosen to be slightly greater than the thickness of the circuit board 26 so that the pad is compressed slightly when the bolts 90 are tightened. This causes the plates 78 to urge their contact pads 82 into pressing engagement with the underside of the membrane 22 so that the contact surfaces 44 on the other side of the membrane are urged into electrical engagement with their respective raised contacts 40. The hardness of the rubber pad 74 is chosen so that the resulting force between each of the contact surfaces 44 and their respective raised contacts 40 is a specific desired value. In the present example, the rubber pad 74 has a hardness of between 30 and 35 durometer and a thickness of about 0.060 inch, yielding a contact force of about 7 grams at each contact. This contact force can be varied by changing the thickness of the rubber pad 74 so that it is compressed more or less when the bolts 90 are tightened. The contact pads 82 have a hardness of between 50 and 60 durometer and a thickness of about 0.010 inch, in the present example, so that they provide a relatively firm pressure against the underside of the membrane urging the contact surfaces 44 into electrical engagement with their respective raised contacts 40 on the chips 20. It is desirable to not have the contact pads 82 too hard because the surfaces of the plates 78 and the tips of the raised contacts 40 may be nonplanar to some small degree. It is preferable if the contact pads 82 are resilient enough to take up any such deviations. While rubber is utilized for the pads 74 and 82, in the present example, other suitable resilient structures, such as metal or plastic spring members, may be used to practice the teachings of the present invention.

Figure 6:
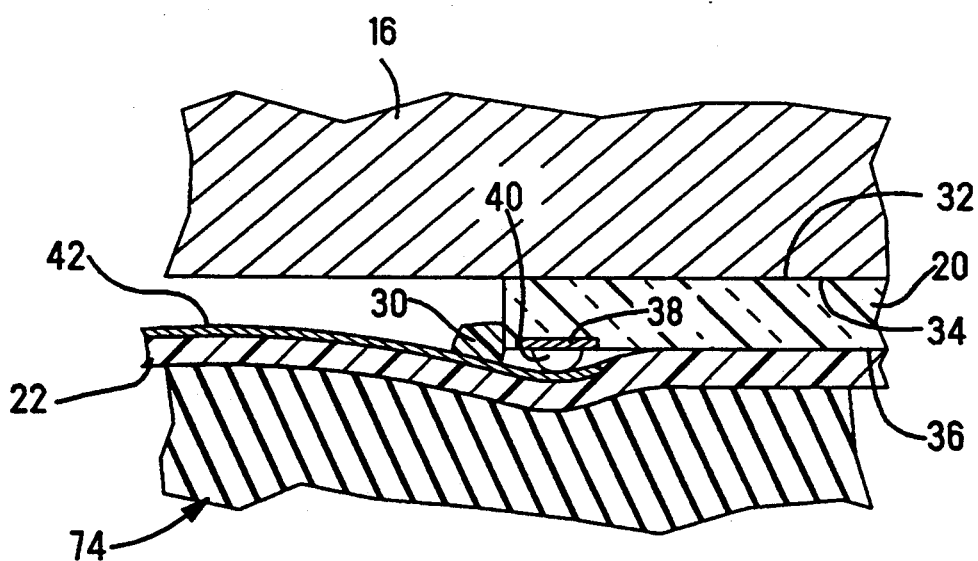
FIG. 6 is a view similar to that of FIG. 5 showing a multichip module with a soft rubber member for providing contact pressure.

In contrast to the teachings of the present invention, if the plates 78 and their associated pads 88 were removed, as shown in FIG. 6, the relatively soft rubber pad 74 would deform the membrane 22 around each of the chips 20 and into the space therebetween. This, of course, would create very high tensile stresses in the membrane resulting in permanent deformation of the membrane or its separation from the frame 24. Where it is desirable to increase contact force, the hardness of the pad 74 would have to be increased or the amount of compression increased, however, this would increase the tensile stress in the membrane still further. Such disadvantages are avoided in the present invention.

Therefore, an important advantage of the present invention is that the contacts on the thin film membrane are pressed into electrical engagement with the contacts on the chips without damage to the delicate thin film membrane itself. Additionally, the actual contact force can be easily varied by simply varying the thickness of the rubber pad 74 without adversely affecting the membrane.

I claim:

1. In an integrated circuit chip module assembly comprising:
   (a) a membrane having electrical circuitry thereon including contact surfaces on a first major surface thereof interconnected to said circuitry;
   (b) a support frame attached to at least a portion of the periphery of said membrane thereby supporting said membrane taut so that said first major surface defines a plane; and (c) at least one integrated circuit chip having electrical contacts on a surface thereof interconnected to circuitry on said chip, each said contact projecting outwardly from said surface into electrical engagement with a respective one of said contact surfaces of said membrane, a contact pressure equalizer arranged in pressing engagement only with selected areas of a second major surface of said membrane opposite said first major surface, said selected areas being substantially opposite said contacts so that said contact surfaces of said membrane are urged against their respective said contacts of said chip.

2. The module assembly according to claim 1 wherein said at least one integrated circuit chip is a plurality of individual chips and said contact pressure equalizer includes:

(a) a plurality of plates, each of which is associated with a respective one of said integrated circuit chips, each said plate having a surface opposing said surface of its respective associated chip; and (b) a first elastic member on said surface of each said plate in engagement only with said selected areas of said second major surface of said membrane that are opposite said contacts of its respective associated chip.

3. The module assembly according to claim 2 including a second elastic member urging each said plate toward said surface of its respective associated chip so that said first elastic member of each said plate urges said contact surfaces of said membrane against said contacts on its respective associated chip with a specific contact force.

4. The module assembly according to claim 3 including a pressure plate having a substantially planar major surface, wherein said second elastic member is between and in engagement with said planer major surface and each of said plurality of plates.

5. The module assembly according to claim 4 including a substrate having circuitry thereon, wherein said support frame is attached to said substrate and said circuitry on said membrane is interconnected with said circuitry on said substrate, said substrate being against said planar surface of said pressure plate and having an opening therein, said second elastic member being within said opening.

6. The module assembly according to claim 3 wherein the hardness of said second elastic member is less than the hardness of said first elastic member.

7. The module assembly according to claim 6 wherein said first and second elastic members are rubber having hardness values of between about 40 to 70 durometer and between about 27 to 38 durometer, respectively.

8. The module assembly according to claim 7 wherein said hardness values of said first and second elastic members are between about 50 to 60 durometer and between about 30 to 35 durometer, respectively.

9. A contact pressure equalizer for use in an integrated circuit chip module assembly, wherein said assembly includes a membrane having electrical circuitry thereon including contact surfaces on a first major surface interconnected to said circuitry and a plurality of integrated circuit chips having contacts on surfaces thereof projecting outwardly therefrom into electrical engagement with respective ones of said contact surfaces of said membrane, said contact pressure equalizer comprising:

(a) a plurality of plates, each of which is positioned to be associated with a respective one of said integrated circuit chips, each said plate having a surface arranged to oppose said surface of its respective associated chip; and (b) a first elastic member on said surface of each said plate arranged for pressing engagement only with selected areas of a second major surface of said membrane opposite said first major surface, said selected areas being substantially opposite said contacts of a respective associated chip, so that when said contact pressure equalizer is in engagement with said membrane said contact surfaces of said membrane are urged against and in electrical engagement with respective said contacts of said chips.

10. A contact pressure equalizer according to claim 9 including a second elastic member arranged for urging each said plate toward said surface of its respective associated chip so that said first elastic member of each said plate urges said contact surfaces of said membrane against said contacts on its respective associated chip with a specific contact force.

11. A contact pressure equalizer according to claim 10 including a pressure plate having a substantially planar major surface, wherein said second elastic member is between and in engagement with said planer major surface and each of said plurality of plates.

12. A contact pressure equalizer according to claim 10 wherein the hardness of said second elastic member is less than the hardness of said first elastic member.

13. A contact pressure equalizer according to claim 12 wherein said first and second elastic member are rubber having hardness values of between about 40 to 70 durometer and between about 27 to 38 durometer, respectively.

14. A contact pressure equalizer according to claim 13 wherein said hardness values of said first and second elastic member are between about 50 to 60 durometer and between about 30 to 35 durometer, respectively.

* * * * *